(12) United States Patent
Kim et al.

(10) Patent No.: US 8,317,364 B2
(45) Date of Patent: *Nov. 27, 2012

(54) LIGHTING APPARATUS

(75) Inventors: Kyunghyun Kim, Seoul (KR); Sejoon You, Seoul (KR); Hyunha Kim, Seoul (KR); Hankyu Cho, Seoul (KR); Jeongsoo Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/277,567

(22) Filed: Oct. 20, 2011

(65) Prior Publication Data

US 2012/0033423 A1 Feb. 9, 2012

Related U.S. Application Data

(63) Continuation of application No. 13/210,683, filed on Aug. 16, 2011.

(30) Foreign Application Priority Data

May 2, 2011 (KR) .................... 10-2011-0041431

(51) Int. Cl.
*F21V 7/00* (2006.01)

(52) U.S. Cl. ........ 362/241; 362/294; 362/247; 362/298; 362/373

(58) Field of Classification Search .................. 362/241, 362/247, 298, 294, 373, 294.373
See application file for complete search history.

(56) References Cited

U.S. PATENT DOCUMENTS

| 7,645,053 B2* | 1/2010 | Machi et al. ................... 362/241 |
| 7,914,178 B2* | 3/2011 | Xiang et al. ................... 362/294 |
| 8,061,875 B2* | 11/2011 | Zhang ........................... 362/294 |
| 8,070,328 B1* | 12/2011 | Knoble et al. ........... 362/311.02 |
| 2011/0128733 A1* | 6/2011 | Chen et al. ..................... 362/235 |

OTHER PUBLICATIONS

U.S. Office Action dated Jan. 24, 2012 (U.S. Appl. No. 13/210,683).

* cited by examiner

*Primary Examiner* — Stephen F Husar
*Assistant Examiner* — James Cranson, Jr.
(74) *Attorney, Agent, or Firm* — KED & Associates, LLP

(57) ABSTRACT

A lighting apparatus is broadly disclosed and embodied herein. The lighting apparatus may include a heat sink, a first reflector provided over the heat sink, a light emitting module provided at the first reflector, an enclosure provided over the heat sink to surround the light emitting module, and a second reflector provided over the light emitting module. At least a portion of the light emitted from the light emitting module may be reflected at least in a direction a prescribed angle below a horizontal plane of the light emitting module.

19 Claims, 14 Drawing Sheets

LIGHTING APPARATUS

CROSS-REFERENCE TO RELATED APPLICATION(S)

This application is a continuation of U.S. patent application Ser. No. 13/210,683, filed on Aug. 16, 2011, which claims priority under 35 U.S.C. §119 to Korean Application No. 10-2011-0041431 filed in Korea on May 2, 2011, whose entire disclosure is hereby incorporated by reference.

BACKGROUND

1. Field

The present disclosure relates to a lighting apparatus, more particularly, to a lighting apparatus which can reflect light emitted from a light-emitting diode toward omnidirectional regions to radiate light broadly with a uniform light intensity and which can illuminate a light radiation region distant from a light source.

2. Background

Generally, the lighting industry has been under sustainable development and various studies on light sources, a light-emitting method, a driving method and lighting efficiency improvement have been made. A light source used in a lighting apparatus may be an incandescent lamp, an electric-discharge lamp, a fluorescent lamp or another appropriate type of light source based on various applications of the lighting apparatus such as for domestic usage, landscape usage, industrial usage, or the like.

The incandescent lamp which is a resistive light source has disadvantages due to relatively poor light-emitting efficiency and heat-radiation. The electric-discharge lamp has high costs and uses a high voltage. The fluorescent lamp is harmful to the environmental as they use mercury.

To solve those disadvantages of such light sources, interest in light emitting diodes (LED) have been increasing because they have advantages in greater light emitting efficiency, and offer greater flexibility in structural as well as aesthetic designs. For example, LEDs may be configured to emit light in various colors.

Moreover, LEDs use a semiconductor element which emits light when a forward voltage is applied to the LED. Hence, LEDs may have a greater lifecycle as well as lower power consumption. In addition, LEDs have electrical, optical and physical properties which are amenable to mass production. Hence, the LEDs have been rapidly replacing the incandescent lamps and fluorescent lamps.

However, LEDs have a relatively small light radiation angle and lower light distribution characteristics. Hence, an area which can be illuminated by an LED light source may be relatively smaller. For example, when an LED type lighting apparatus having a small light radiation angle is installed on a ceiling, the lighting apparatus may be limited to illuminating relatively small areas located directly below the light source. Hence, the lighting apparatus may not be effective in use for illuminating a wide area and may fail to supply a sufficient intensity of illumination to relatively distant areas. As a result, a greater number of LED type lighting apparatuses may be required to maintain sufficient intensity to illuminate a wide area when compared to traditional type of lighting sources. Accordingly, installation costs may also increase.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

A lighting apparatus as broadly described and embodied herein allows a more efficient utilization and conservation of energy resources. The lighting apparatus according to exemplary embodiments of the present disclosure will be described in detail hereinbelow with reference to the accompanying drawings. The accompanying drawings are illustrated to describe examples of the present disclosure and they are provided to explain the present disclosure more specifically, as the present disclosure is not limited thereto. Wherever possible, the same reference numbers will be used throughout the drawings to refer to the same or like parts. Repeated description will be omitted and the size and appearance of each part illustrated for convenience in explanation may be exaggerated or minimized.

Moreover, terminology including ordinal numbers such as 'first' and 'second' are merely used to describe various parts of the present disclosure and do not limit the various parts described by the terminology. That is, the terminology is used merely to distinguish one of the parts from the others.

Figure 1:
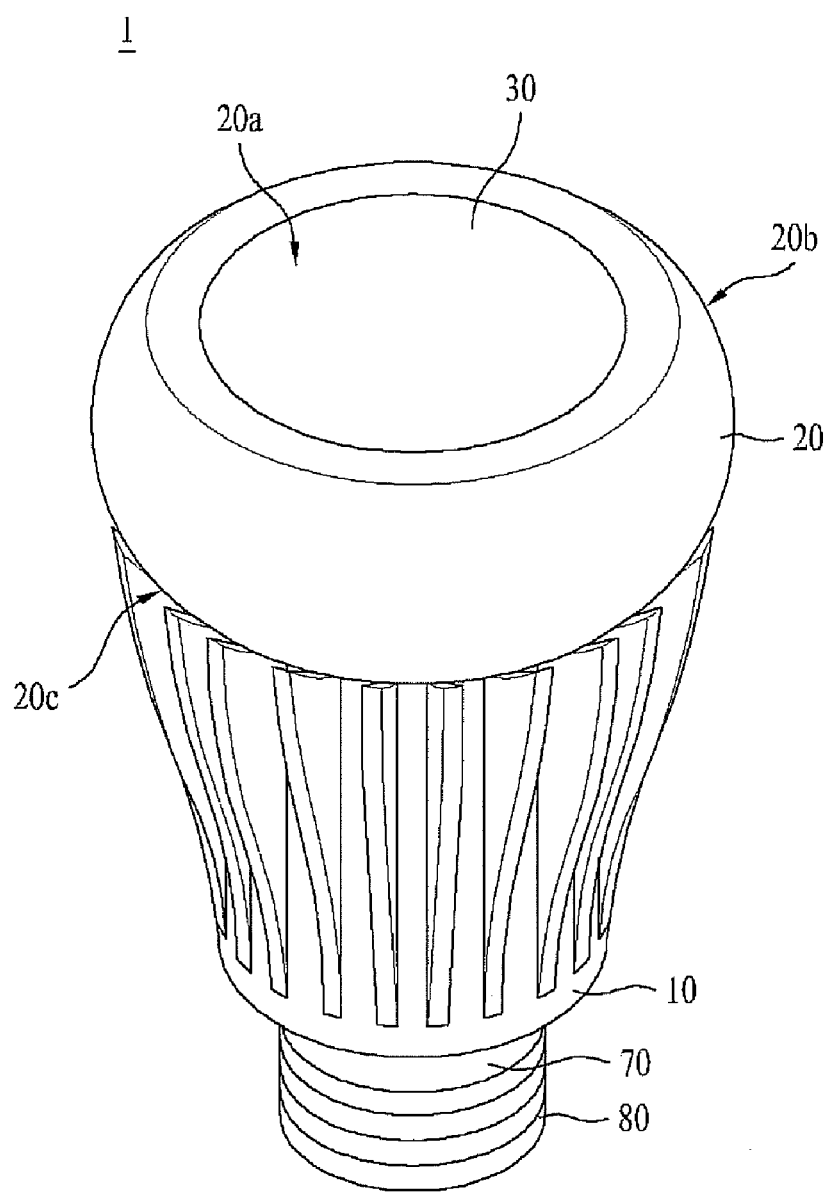
FIG. 1 is a perspective view illustrating a lighting apparatus according to an exemplary embodiment of the present disclosure.
Figure 2:
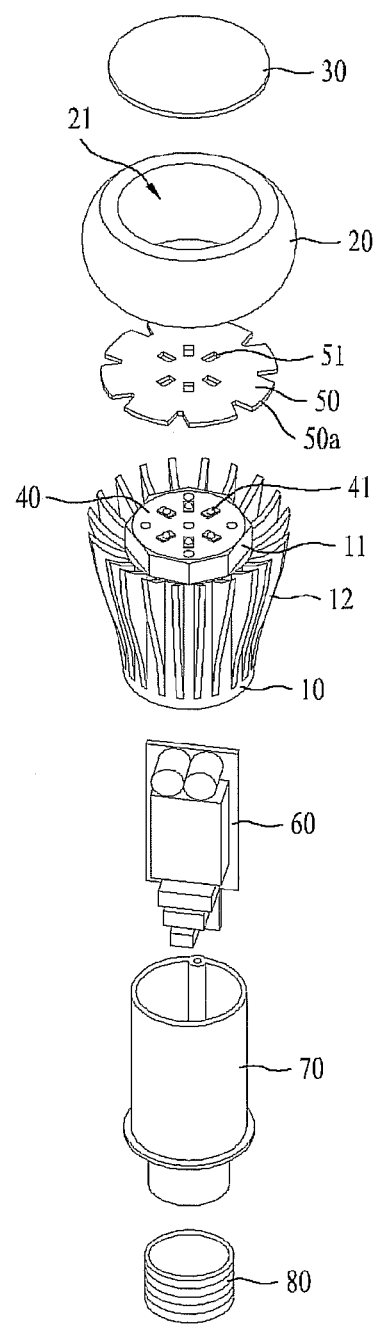
FIG. 2 is an exploded perspective view illustrating the lighting apparatus according to the embodiment of the present disclosure.
Figure 3:
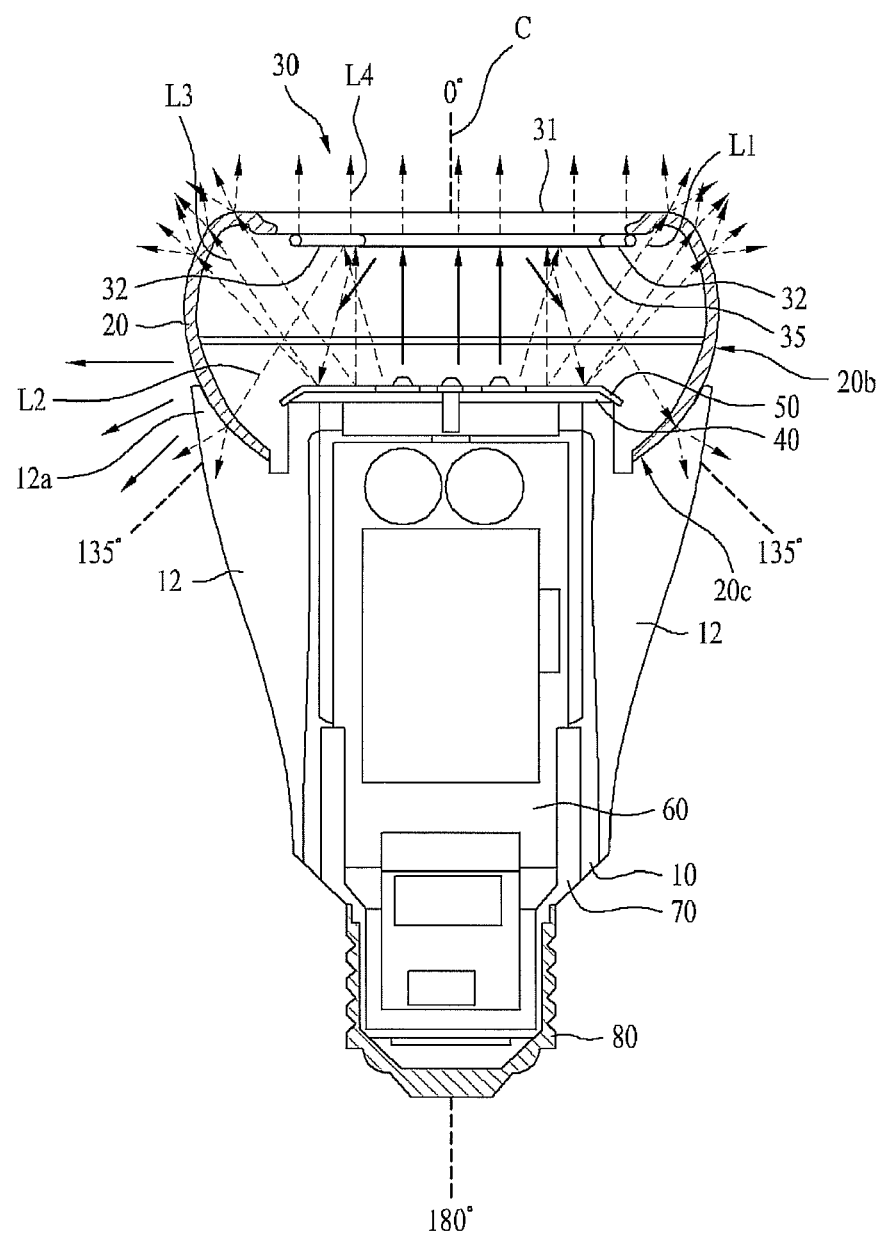
FIG. 3 is a sectional view illustrating an operational state of the lighting apparatus according to the embodiment of the present disclosure.

FIG. 1 is a perspective view illustrating a lighting apparatus according to an exemplary embodiment of the present disclosure. FIG. 2 is an exploded perspective view illustrating the lighting apparatus according to the embodiment and FIG. 3 is a sectional view illustrating an operational state of the lighting apparatus according to the embodiment.

The lighting apparatus 1 according to this embodiment of the present disclosure may be applicable to a bulb type or flat panel type lighting apparatus. However, merely for purposes of discussion, the lighting apparatus is discussed hereinbelow as a bulb type lighting apparatus.

Referring to FIGS. 1 and 2, the lighting apparatus 1 may include a heat sink 10, a lighting emitting module 40, an enclosure 20, an upper reflection member 30 (upper reflector) and a lower reflection member 50 (lower reflector). Specifically, the lighting apparatus 1 may include the heat sink 10, at least one lighting emitting module 40 arranged on the heat sink 10, the enclosure 20 having transmission regions 20b and 20c and a reflection region 20a that surrounds the light emitting module 40, and an upper reflector 30 and a lower reflector 50 mounted to the enclosure 20 and the heat sink 10, respectively, to guide a light radiated from the light emitting module 40 toward the transmission regions 20b and 20c of the enclosure 20.

Here, the enclosure 20 may be a bulb. Moreover, the reflection region 20a of the bulb 20 may include a center region of the bulb 20 such that the light radiated from the light emitting module 40 is emitted towards the center region of the bulb 20. The transmission region may include an omnidirectional side region 20b of the bulb 20. The omnidirectional side region 20b may be a side surface of the bulb 20 having a prescribed curvature and extends from the reflection region 20a.

The reflection region 20a refers to a region where light is reflected rather than transmitted through the bulb 20. Here, a reflectance of the reflection region 20a may be 90% or more, specifically, 90% or more with respect to light having a wavelength range near approximately 550 nm. A portion of light L4 radiated from the LED 41 may be transmitted through the reflection region 20a, as shown in FIG. 3. The reflection region 20a of the bulb 20 may be positioned around or adjacent to a central axis C of the bulb 20. The central axis C of the bulb 20 may be substantially parallel to a direction of light emitted from the light emitting module 40. Moreover, referring to FIG. 2, an opening 21 (through-hole) may be provided in the center region of the bulb 20. The upper reflector 30 may be mounted to the opening 21 to form the reflection region 20a of the bulb 20.

The lower reflector 50 having a predetermined area and a profile may be arranged over the light emitting module 40, spaced apart a predetermined distance from the upper reflector 30. For example, FIG. 2 shows that the upper reflector 30 may form a predetermined region of the bulb 20, however, the present disclosure is not limited thereto. Alternatively, the upper reflector 30 may be arranged within the bulb 20, for example.

The light emitting module 40 may include at least one LED 41. The LED 41 may be a chip on board (COB) LED. Here, the light emitting module 40 may be a thin GaN LED. In the thin GaN LED, a reflection sheet may be provided under the active layer to reflect light emitted from the active layer to be emitted upward toward a prescribed direction. The thin GaN LED has excellent heat radiation characteristics and high output power when compared to traditional light sources. It should be appreciated, however, that while the light emitting module 40 is disclosed herein as having LEDs as the light source, this disclosure is not limited thereto, and various other types of light sources may be used that generate directional light (e.g., light having highly concentrated intensity in a narrow range) which may require distribution or dispersion.

As mentioned above, the LED 41 may have a relatively low light radiation angle that deteriorates light distribution and reduces a size of the illumination region. In addition, the LED 41 may have strong directionality which may cause glare which may be unpleasant to a user.

Specifically, the LED 41 of the light emitting module 40 may emit light that is highly directional and may have relatively poor light distribution angles. If the light distribution ability is deteriorated, the distance between the lighting apparatuses must be reduced, requiring installation of a greater number of lighting apparatuses to illuminate a given area. Moreover, the directionality of the LED 41 may cause a hot spot or glare phenomenon if the user looks directly into the lighting apparatus 1.

Therefore, the present disclosure provides the lighting apparatus 1 which can reflect the light emitted from the LED 41 toward an omnidirectional side region to radiate the light over a broad illumination region. The upper and lower reflectors 30 and 50 may guide the light emitted from the LED 41 toward the omnidirectional side region 20b of the bulb 20.

Moreover, the upper and lower reflectors 30 and 50 may guide the light emitted from the LED 41 toward a lower region 20c of the bulb 20. The lower region 20c of the bulb 20 may form a portion of the transmission region together with the omnidirectional side region 20b. The lower region 20c may be a side surface of the bulb 20 having a predetermined curvature and which is positioned adjacent to the omnidirectional side region 20b at a lower portion of the bulb 20. Here, the prescribed curvature of the lower region 20c may be different from the prescribed curvature of the omnidirectional side region 20b. The light emitted outside of the bulb 20 through the lower region 20c may be radiated toward the heat sink 10.

In reference to FIG. 3, light emitted through the transmission region 20b of the bulb 20 may follow a first light path L1 to be emitted directly from the light emitting module, a second light path L2 in which the light is reflected by the upper reflector 30, and a third light path L3 in which light is reflected by the lower reflector 50.

Omnidirectional light distribution as referred to herein refers to technology capable of securing a minimum light velocity of 5% or more at a light distribution angle of 135° or more, and having an average light velocity difference of 20% or less at a predetermined light distribution angle of 0° to 135°. In other words, luminous intensity (candelas) of the omnidirectional lighting apparatus 1 may be evenly distributed in a zone or angular range within 0° to 135°, measured from an optical center of the lighting apparatus. This light distribution zone may be vertically axially symmetrical. At least 5% of total flux (lumens) may be emitted in the zone within 135° to 180°. Moreover, luminous intensity at any angle within the 0° to 135° zone may not differ from the mean luminous intensity for the entire zone by more than 20%.

The optical center of the lighting apparatus 1 may be a central axis C of the bulb 20. The angles for light distribution may be measured relative to the central axis C of the bulb 20. The lighting apparatus according to this embodiment of the present disclosure may provide omnidirectional light distribution through use of a structure having the upper and lower reflectors 30 and 50.

Figure 4:
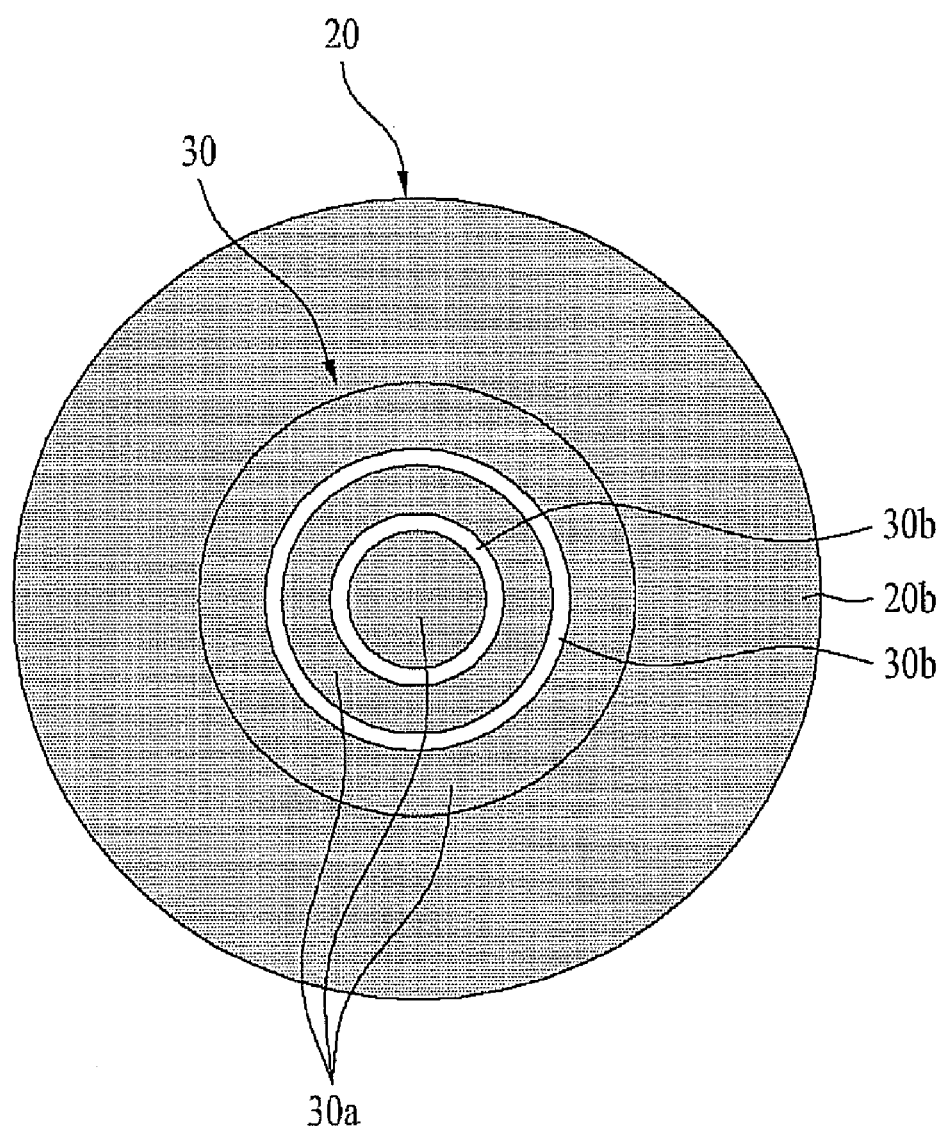
FIG. 4 is a plan view of a bulb provided in the lighting apparatus according to an embodiment of the present disclosure.
Figure 5:
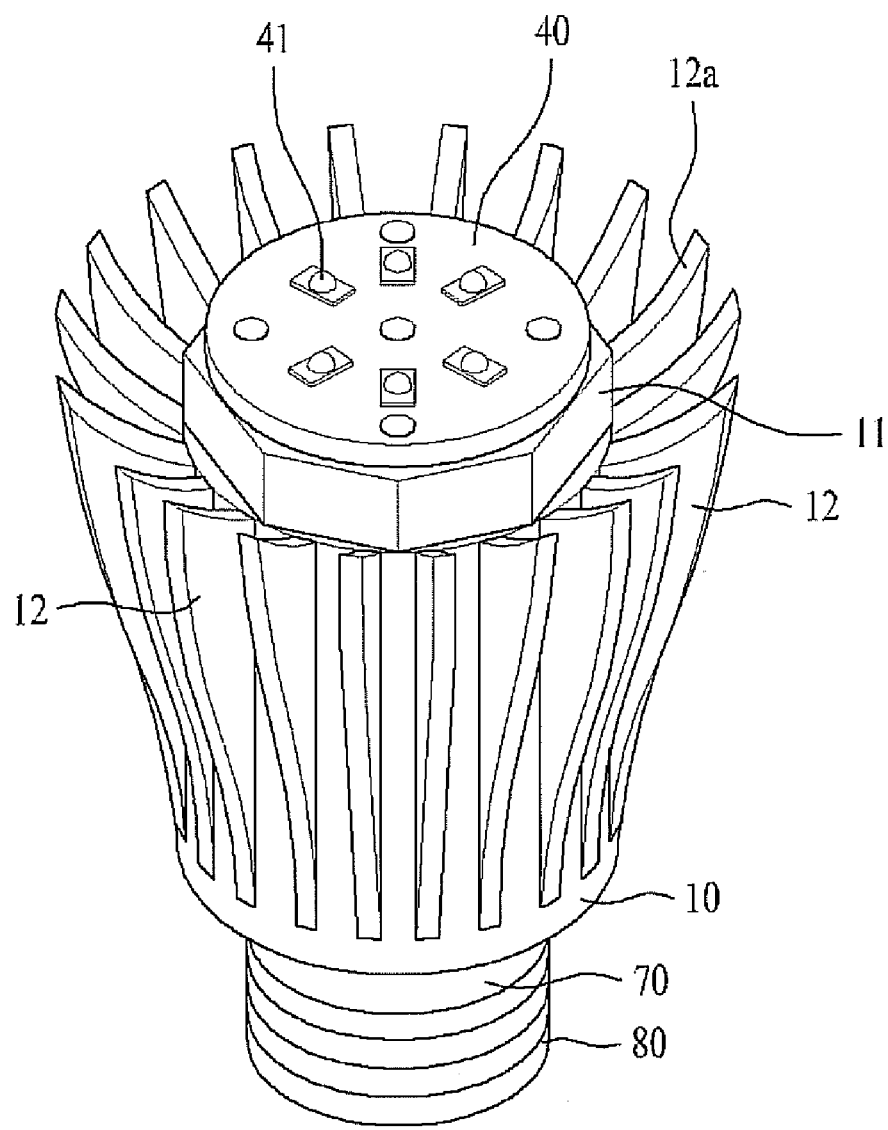
FIG. 5 is a perspective view illustrating various components of the lighting apparatus according to an embodiment of the present disclosure.
Figure 6:
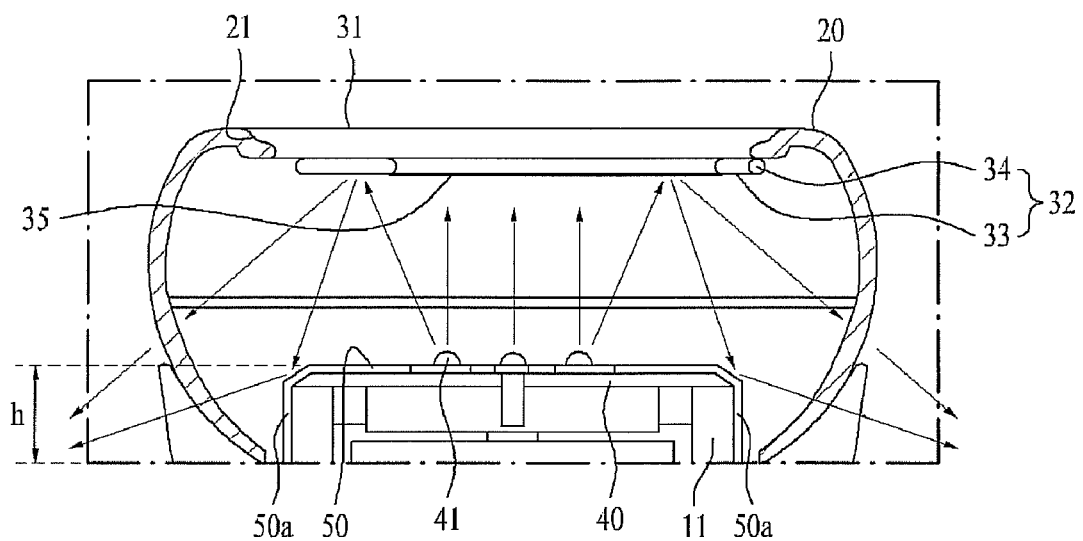
FIG. 6 is a partial sectional view illustrating an operational state of the lighting apparatus according to an embodiment of the present disclosure.

FIG. 4 is a plan view illustrating the bulb provided in the lighting apparatus according to an embodiment of the present disclosure. FIG. 5 is a perspective view illustrating various components of the lighting apparatus according to an embodiment of the present disclosure. FIG. 6 is a partial sectional view illustrating an operational state of the lighting apparatus according to an embodiment of the present disclosure.

In reference to FIG. 4, the upper reflector 30 which forms a portion of the transmission region of the bulb 20 may include at least one transmission region 30b that externally transmits the light emitted from the light emitting module 40. In other words, the first reflector 30 may include a reflection region 30a and a transmission region 30b. The first reflector 30 may reflect the light emitted by the LED 41 to have a predetermined pattern or design via the transmission region 30b. The transmission part 30b may enhance a design quality and/or optical efficiency of the lighting apparatus 1.

Moreover, the transmission region 30b of the upper reflector 30 may be positioned to be eccentric with respect to an optical axis of the light emitting module 40. For example, the optical axis may represent an axis corresponding to the direction of light emitted from the LED 41. The transmission part 30b of the upper reflector 30 may be positioned away from this axis. Hence, hot spots or the glares may be prevented.

The lower reflector 50 may be mounted to the heat sink 10, and formed to surround the light emitting module 40. The lower reflector 50 may be a reflection film having at least one hole 51 formed to expose the LED 41 of the light emitting module 40. In addition, the lower reflector 50 may be formed of a material capable of reflecting 90% or more of the light having a wavelength range at approximately 500 nm.

Moreover, the lower reflector 50 may include at least one of a plane portion and a curved portion having a convex or concave curvature. The curved surfaces may reflect light incident on the lower reflector 50 to be reflected toward a predetermined region.

In reference to FIGS. 5 and 6, it is easy to process the lower reflector 50 which is a reflection film. Hence, the hole 51 is formed to expose the LED 41 and the second reflector 50 may have a structure that surrounds the other surfaces of the light emitting module 40, except the LED 41, such that a surface area of the reflector may be maximized.

Moreover, the light emitting module 40 having the at least one LED 41 mounted therein may generate heat during operation. Hence, the light emitting module 40 may be mounted to the heat sink 10 having good heat radiation efficiency to dissipate the heat. A seating part 11 formed in a predetermined shape may be provided in an upper end of the heat sink 10 and the light emitting module 40 may be mounted to the seating part 11 by a securing member such as a bolt.

In reference to FIG. 6, the seating part 11 may be a projection that is projected a predetermined height (h) from the lower region 20c of the bulb 20 or a lower end of the transmission region. The seating part 11 may be formed as a platform having a top and side surfaces. For example, a top surface of the seating part 11 may be a predetermined height (h) from a lower circumferential edge of the bulb 20. At this time, the lower reflector 50 may be mounted to surround the light emitting module 40 as well as the side area (or side surfaces) of the seating part 11 to increase the reflective surface area of the reflector.

Moreover, the side surface of the seating part 11 may comprise a plurality of flat surfaces or a curved surface depending on the desired light distribution characteristics and/or the shape of the lower reflector 50. For example, a plurality of flat side surfaces together with a lower reflector 50 shaped as shown in FIG. 2 may provide a better coverage as well as to simplify the manufacturing and assembly processes. In this case, the tabbed outer edges 50a of the lower reflector 50 may be bent to cover each of the side surfaces of the seating portion 11.

Alternatively, the light emitting module 40 may be located on the same plane with the lower end of the transmission region formed in the bulb 20. This structure may not provide a height difference between the lower region 20c of the bulb 20 and the light emitting module 40, only to increase an internal space of the bulb 20. The light radiated from the LED 41 can be radiated with a uniform light intensity, passing the omnidirectional side region 20b and the lower region 20c with respect to a central axis C of the bulb 20.

To enhance reflection efficiency and to increase the reflective surface area of the reflector, an edge part 50a (tab) of the second reflector 50 may be bent toward the lower end 20c of the transmission region of the bulb 20. Alternatively, the edge part 50a may contact the lower end 20c of the transmission region of the bulb 20. Moreover, the lower reflector 50 may be secured to the seating part 11 of the heat sink 10 by a screw, together with the light emitting module 40.

This structure mentioned above may reduce a gap between the light emitting module 40 and the upper reflector 30 and may increase the amount of light emitted through the lower region 20c of the bulb 20 surrounding the heat sink 10. Hence, the light radiated from the LED 41 may be radiated through the omnidirectional side region 20b and the lower region 20c with respect to the central axis C of the bulb while having a uniform light intensity.

In the meanwhile, the heat sink 10 may be formed of a metal material to radiate the heat generated in the light emitting module 40 effectively. A plurality of heat radiation fins 12 may be provided on an outer circumferential surface of the heat sink 10 to increase a radiation area (e.g., the surface area of the heat sink 10). According to an embodiment, the plurality of the heat radiation fins 12 may be arranged on an outer circumferential surface of the heat sink 10 along a circumferential direction.

In reference to FIGS. 2 and 3, an upper longitudinal end 12a of the heat radiation fins 12 may surround the lower end 20c of the transmission region to scatter the light emitted through the transmission region 20b and 20c of the bulb 20. The longitudinal end 12a may be formed as a surface that corresponds to a shape of the bulb 20. The upper longitudinal end 12a of the heat radiation fins 12 may contact the bulb 20 to further enhance the heat transfer to the heat sink 10. In certain embodiments, the upper longitudinal end 12a may include a coating or film provided thereon to further enhance the dispersion of light incident thereon. Moreover, to reduce interference with the light radiated to the lower region 20c of the bulb 20 and to enhance the heat radiation effect, the ends of the heat radiation fins 12 may be curved upwards toward the bulb 20.

Figure 7:
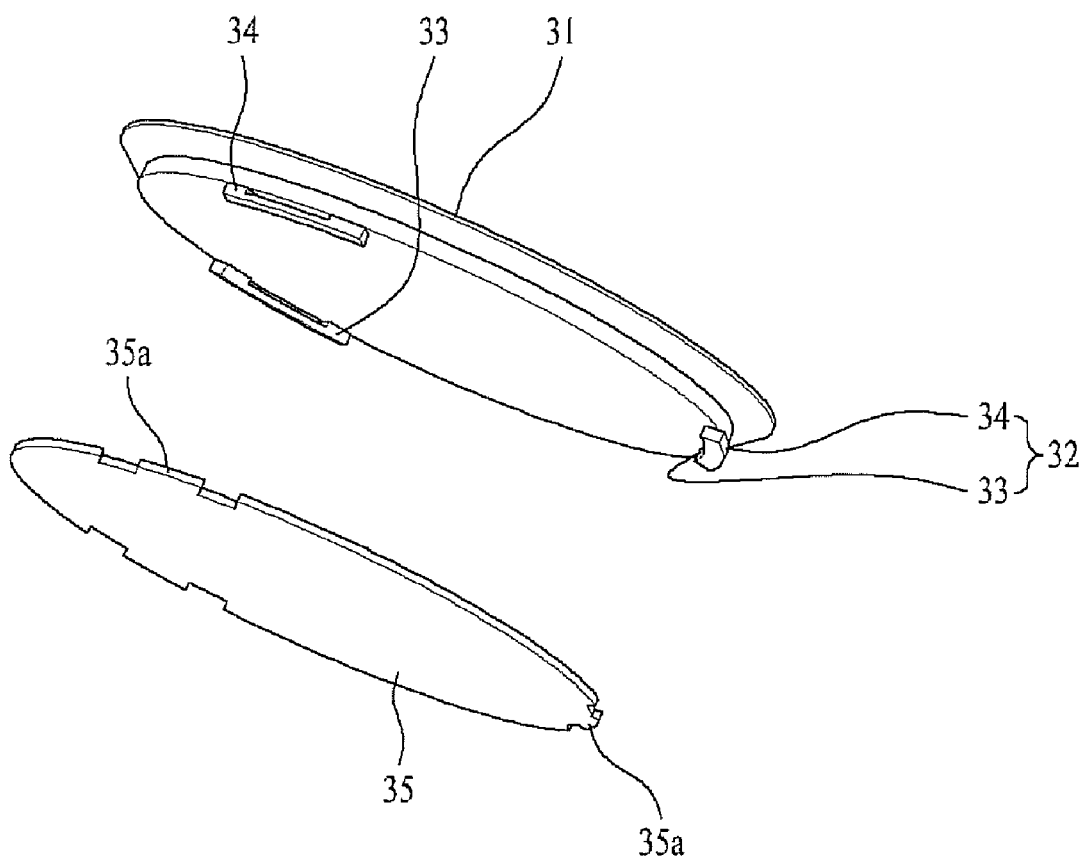
FIG. 7 is an exploded perspective view illustrating a holder and a reflection film provided in the lighting apparatus according to an embodiment of the present disclosure.
Figure 8:
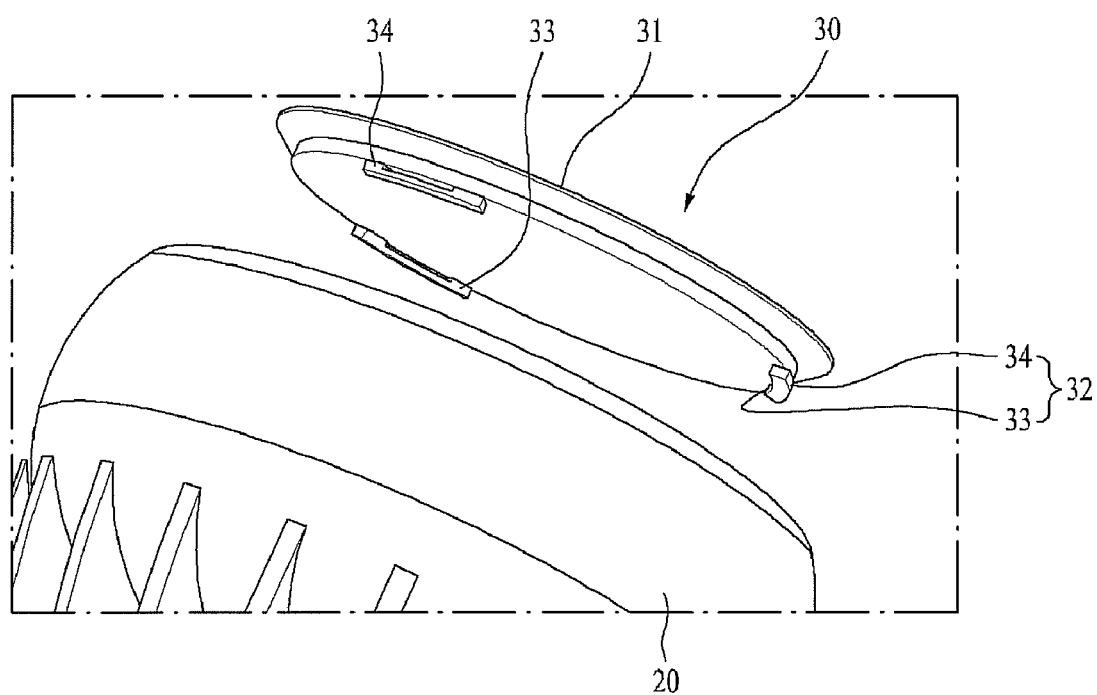
FIG. 8 is a partial exploded perspective view illustrating a reflector and a bulb provided in the lighting apparatus according to an embodiment of the present disclosure.
Figure 9:
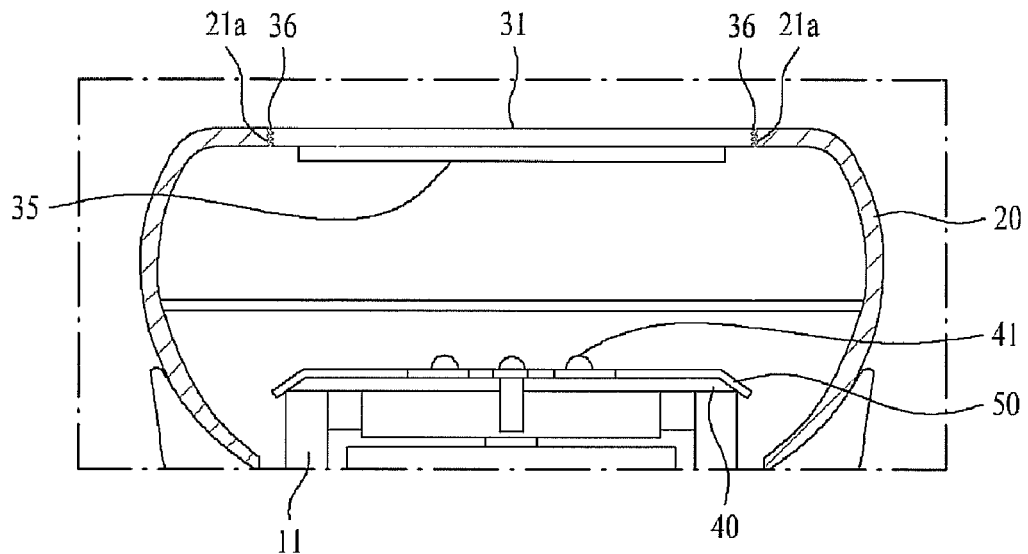
FIG. 9 is a partial sectional view of the lighting apparatus according to one embodiment of the present disclosure.

As follows, the upper reflector 30 will be described in detail in reference to the accompanying drawings. FIG. 7 is an exploded perspective view illustrating a holder and a reflection film which are provided in the lighting apparatus according to an embodiment of the present disclosure. FIG. 8 is an exploded perspective view illustrating the upper reflector and the bulb of the lighting apparatus according to an embodiment of the present disclosure. FIG. 9 is a sectional view illustrating various components of the lighting apparatus according to an embodiment of the present disclosure.

The upper reflector 30 may be formed of a predetermined material capable of reflecting 90% or more of light having a wavelength range near approximately 550 nm. The upper reflector 30 may have a structure including a substrate formed of a resin material, for example, and a reflection layer formed on an inner circumferential surface of the substrate. As mentioned above, the upper reflector 30 may form the reflection region 20a of the bulb 20.

The upper reflector 30 may include at least one of a plane part and a curved part having a convex or concave curvature. The curved part may be employed to guide light incident on the upper reflector 30 to be reflected toward a predetermined direction. That is, the upper reflector 30 may be formed to have a flat surface shape or a convex or concave lens shape (see FIGS. 12 and 13).

In reference to FIG. 7, the upper reflector 30 may include a holder 31 (body) mounted to the opening 21 of the bulb 20 and a reflection film 35 (reflective film) arranged on an internal surface of the holder 31. A plurality of hooks 32 may be provided in an inner circumferential surface of the holder 31 along a circumferential direction and an edge part 35a of the reflection film 35 may be received in an inner part 33 of the hooks 32.

In reference to FIGS. 8 and 9, the holder 31 may have a circular, oval or polygonal shape based on desired design aspects, and it may be formed of a resin, metal, glass, or another appropriate type of material. The hook 32 may be formed in a variety of shapes which can support the edge part 35a of the reflection film 35.

The holder 31 and the reflection film 35 may be adhered to each other by a double-sided tape. In this case, the double-sided tape may be formed of a predetermined material having a high temperature tolerance to withstand the high temperature environment during operation of the LED 41.

In certain embodiments, the reflection film 35 may be a reflective coating formed on the holder 31. The reflective coating may be selectively applied to form the reflective region 30a and the transmission region 30b on the holder 31. In another embodiment, the reflective and transmission regions 30a and 30b may be formed integrally in the holder 31 without the reflective film 35. In this case, the holder 31 may be formed of multiple types of materials (e.g., a reflective type of material and a translucent or transparent type of material) to form the reflective region 30a and the transmission region 30b.

The holder 31 may be mounted to the opening 21 of the bulb 20 using the hooks 32. An outer part 34 of the hooks 32 provided in the holder 31 may be fixed to an inner circumferential surface of the opening 21 of the bulb 20 (see, for example, FIG. 10). Alternatively, referring to FIG. 9, the bulb 20 may include the opening 21 to mount the holder 31 thereto and the holder 31 may be helically connected to the opening 21. For example, a first set of threads 21a may be provided in an inner circumferential surface of the opening 21 of the bulb 20. A second set of threads 30 may be provided on an outer circumferential surface of the holder 31. Here, the holder 31 may be screwed onto the opening 21 using the threads 21a and 36.

In the meanwhile, a diameter of the reflection film 35 may be between 5 mm to 50 mm. The distance between the light emitting module 40 and the reflector 30 may be between 10 mm to 30 mm, or, approximately 20 mm. However, the diameter and the distance may be based on the omnidirectional light distribution characteristics of the lighting apparatus 1. That is, the diameter and distance may be determined not only in the above discussed ranges but determined through experiment relating to the illumination intensity required by an overall specification of the lighting apparatus, as well as the environment in which the lighting apparatus will be installed.

Referring again to FIGS. 2 and 3, the lighting apparatus 1 may include an electronic module 60 to convert external power into power compatible for use in the light emitting module 40. A housing 70 may be provided to surround the electronic module 60 and may be inserted in an internal space of the heat sink 10. A base 80 may be mounted to a longitudinal end of the housing 70 to be electrically connected with an external power terminal.

Figure 10:
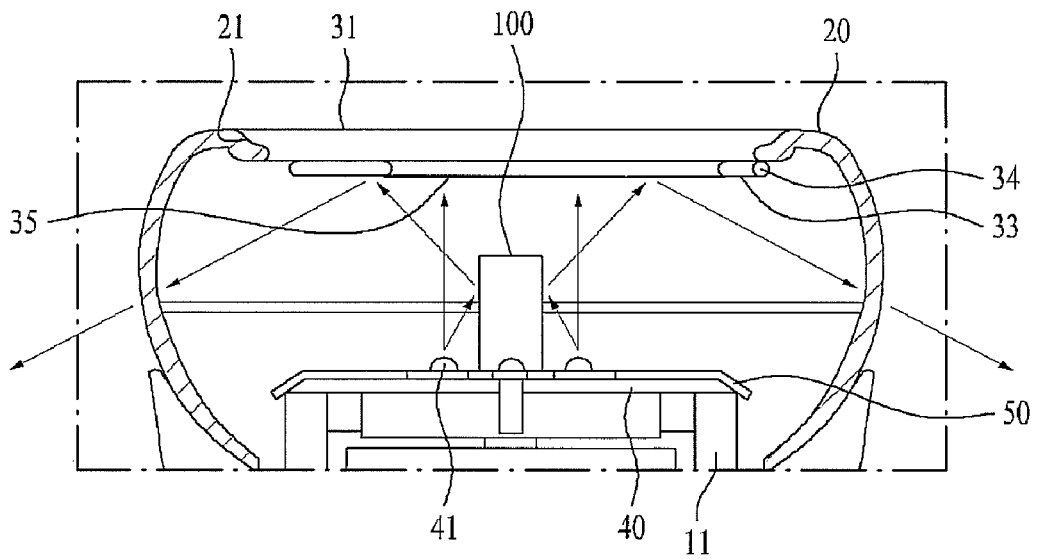
FIG. 10 is a partial sectional view of the lighting apparatus according to one embodiment of the present disclosure.

FIG. 10 is a sectional view illustrating an operational state of the lighting apparatus according to an embodiment of the present disclosure. In this embodiment, the lighting apparatus 1 may further include a third reflector 100 provided on the heat sink 10. The third reflector 100 may be projected from the seating part 11 of the heat sink 10 towards the bulb 20 to have a predetermined height.

According to an embodiment, the third reflector 100 may be a reflection pole. The third reflector 100 may be mounted such that its central axis is positioned at or near the central axis C of the bulb 20. In certain embodiments, the third reflector 100 may extend to connect the upper reflector 30 to the lower reflector 50.

Moreover, the LEDs 41 of light emitting module 40 may be arranged along a circumferential direction with respect to the third reflector 100. That is, the plurality of LEDs 41 may be positioned equidistant relative to the third reflector 100. According to an embodiment, the plurality of LEDs 41 of the light emitting module 40 may also be arranged symmetrically or asymmetrically with respect to the third reflector 100.

Light radiated from the LED 41 may be reflected by the upper reflector 30, the lower reflector 50 and/or the third reflector 100, such that the circuit is uniformly emitted through the transmission regions of the bulb 20, for example, the omnidirectional side region 20b and the lower region 20c. Here, the height and diameter of the third reflector 100 as well as a shape of the side surface (e.g., rounded or hexagonal) may be determined through experiments, in consideration of the illumination intensity required for the installation space of the lighting apparatus as well as the size of the region to be illuminated.

Moreover, the third reflector 100 may be integrally formed with the lower reflector 50. In this case, even an area that borders between the third reflector 100 and the lower reflector 50 may function as a reflection region. Hence, the reflection efficiency may be enhanced.

Figure 11:
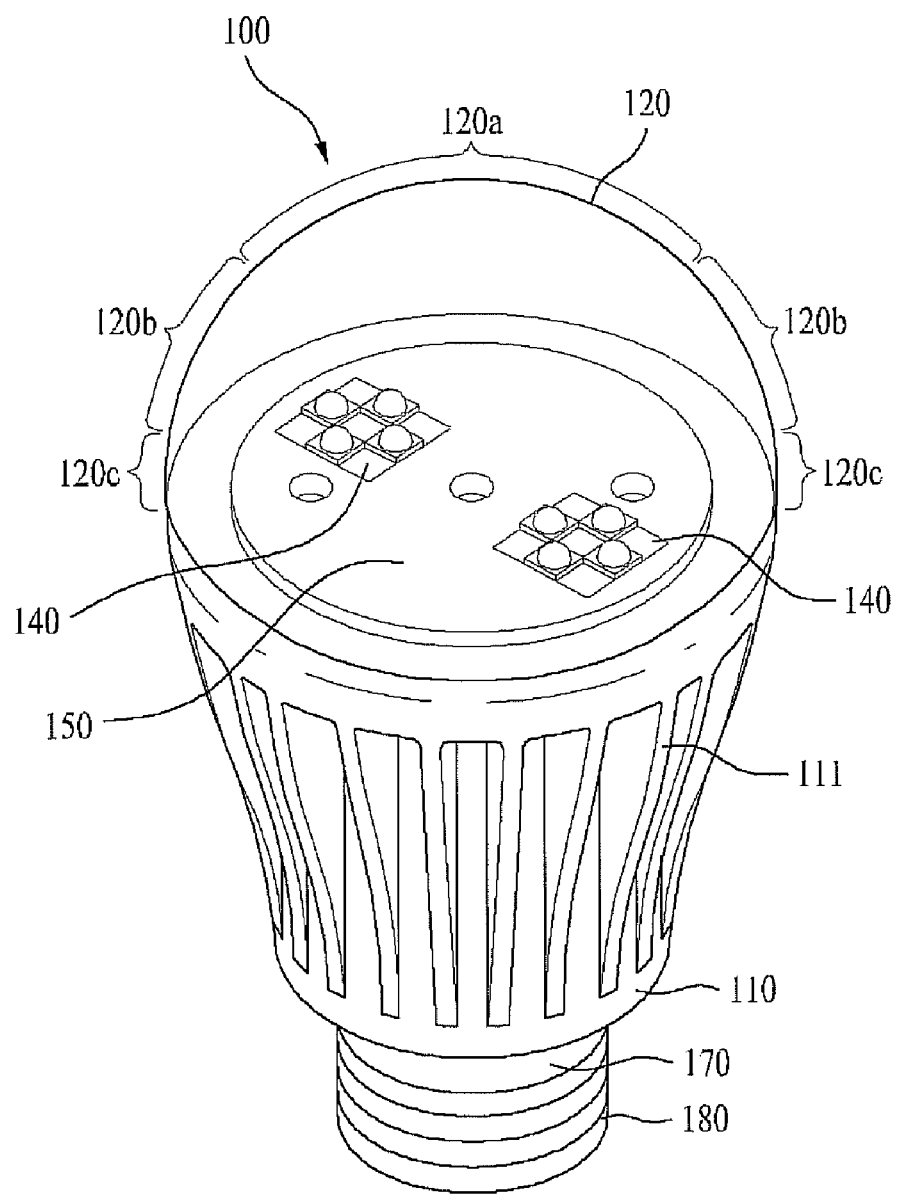
FIG. 11 is a perspective view of a lighting apparatus according to one embodiment of the present disclosure.
Figure 12:
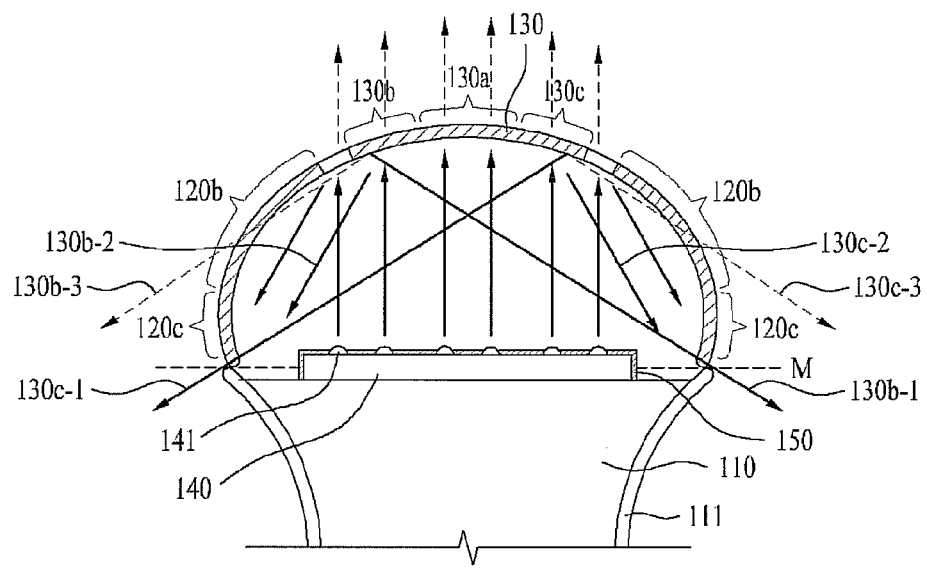
FIG. 12 is a sectional view of the lighting apparatus according to one embodiment of the present disclosure.
Figure 13:
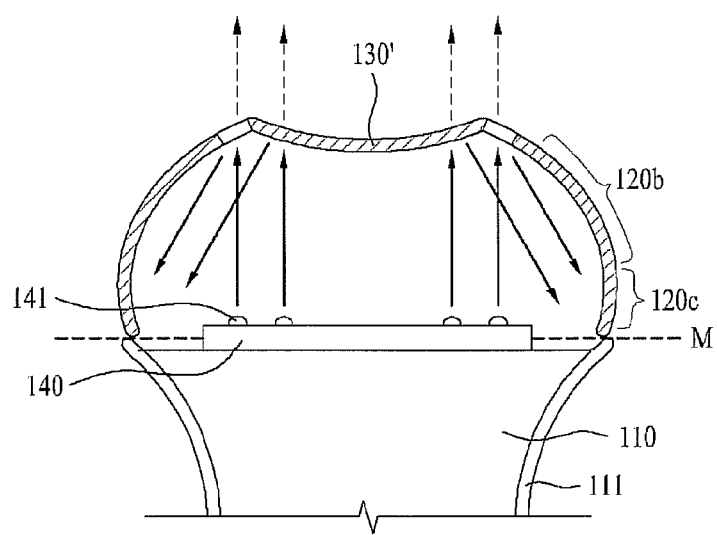
FIG. 13 is a sectional view of the lighting apparatus according to one embodiment of the present disclosure.

FIG. 11 is a perspective view illustrating a lighting apparatus according to another embodiment of the present disclosure. FIG. 12 is a sectional view illustrating various components of the lighting apparatus shown in FIG. 11. FIG. 13 is a sectional view of the lighting apparatus according to another embodiment.

Referring to FIG. 11, a lighting apparatus 100 according to this embodiment of the present disclosure may include a heat sink 110, an electronic module 60 (see FIG. 2) accommodated in the heat sink 110, at least one light emitting module 140 arranged on the heat sink 110 and electrically connected to the electronic module 60, and a bulb 120 mounted to the heat sink 110 to surround the light emitting module 140 and including transmission regions 120b and 120c and a reflection region 120a. The lighting apparatus may also include a reflector configured to reflect light radiated from the light emitting module 140 toward the heat sink 110 via the transmission region 120c of the bulb 120.

Here, the reflection region 120a of the bulb 120 may be positioned near a center region of the bulb 120. The transmission region may include an omnidirectional side region 120b that extends between the reflection region 120a and a lower region 120c positioned above and surrounding the heat sink 110.

Identical to the upper reflector 30 as previously described, the reflector 130 may be employed to reflect the light radiated from the light emitting module 140 not only toward the omnidirectional side region 120b of the bulb 120 but also toward the lower region 120c that surrounds the heat sink 110.

In addition, the lighting apparatus 100 according to this embodiment may include a second reflector 150 which surrounds the outer surfaces of the light emitting module 140 and a portion of the heat sink 110, while exposing LEDs 141 of the light emitting module 140. The second reflector 150 of this embodiment includes the same or similar features to the lower reflector 50 as described previously with reference to FIGS. 2 and 3. Hence, repetitive description of the same or similar features are omitted herein.

Referring to FIGS. 12 and 13, the reflector 130 may be shaped to have a lens-like curvature according to an embodiment and it may form a reflection region when mounted to the bulb 120. The reflector 130 may have a convex curvature with respect to a direction of light emitted from the LED 141, as shown in FIG. 12. In certain embodiments, the reflector 130' may have a concave curvature with respect to the direction of light emitted from the LED 141, as shown in FIG. 13. The concave curvature of the reflector 130' of FIG. 13 may be more effective in reflecting the light toward the omnidirectional side region 120b.

Referring again to FIG. 12, the reflector 130 may be divided into a first to third reflection regions 130a, 130b, and 130c. The first reflection region 130a may allow portion of the light emitted from the LED 141 to be transmitted through the reflector 130 while it reflects or scatters a portion of the light toward the second reflector 150 which may then be reflected towards the omnidirectional side region 120b.

The second reflection region 130b may be angled a prescribed amount to reflect a greater amount of light toward the right side of the bulb 120, as shown by line 130b-1, and a relatively less amount to the left side of the bulb 120, as shown by line 130b-2. Also, the second reflection region 130b may reflect a portion of the light in a direction opposite to the direction in which light is incident (a left omnidirection), as shown by dotted line 130b-3.

Moreover, the third reflection region 130c may be angled to reflect the light toward a left side of the bulb 120, as shown by line 130c-1, and a relatively less amount of light toward the right side of the bulb 120, as shown by line 130c-2. The third reflection region 130c may transmit a portion of light toward a direction opposite to a direction in which light is incident on the third reflection region 130c (a right omnidirection), as shown by line 130c-3.

In certain embodiments, the light emitting module 140 or the LEDs 141 mounted thereon may be positioned substantially on the same plane M as the lower region 120c of the bulb 120. For example, the vertical center of the light emitting module 140 may be positioned at a height which is the same as the height of the lower circumferential edge of the bulb 120, as illustrated in FIGS. 12 and 13. Hence, the height difference between the lower circumferential edge of the bulb 20 (e.g., lower region 120c of the bulb 120) and the light emitting module 140 may be minimized. Hence, an inner space of the bulb 120 may be increased and the light emitted from the LED 140 may be radiated via the omnidirectional side region 120b and the lower region 120c with respect to a central axis C of the bulb 20, with a uniform light intensity.

In certain embodiments, the lighting apparatus 100 may include heat radiation fins 111 that do not surround or overlap the lower region 120c of the bulb 120, as shown in FIGS. 12 and 13. Hence, the intensity of the light transmitted through the lower region 120c of the bulb 120 may be increased. Moreover, as described in reference to FIG. 3, the light emitting module 140 may be arranged to be positioned a predetermined height above the lower circumferential edge (a lower end of the lower region 120c) of the bulb 120.

Figure 14A:
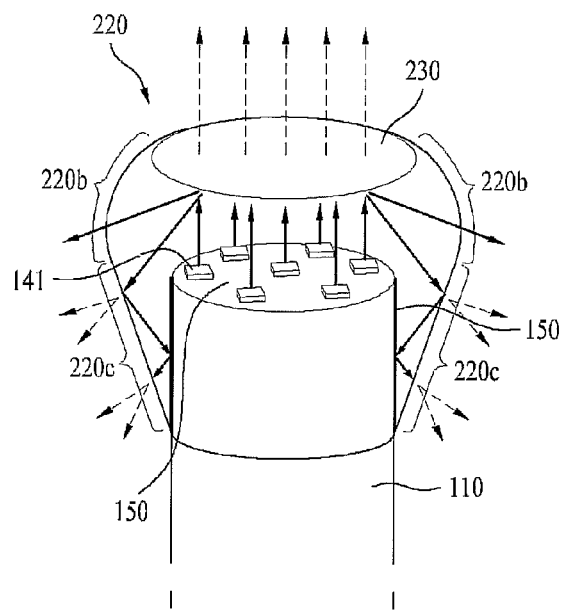
FIGS. 14A and 14B are perspective views illustrating the lighting apparatus according to the present disclosure.
Figure 14B:
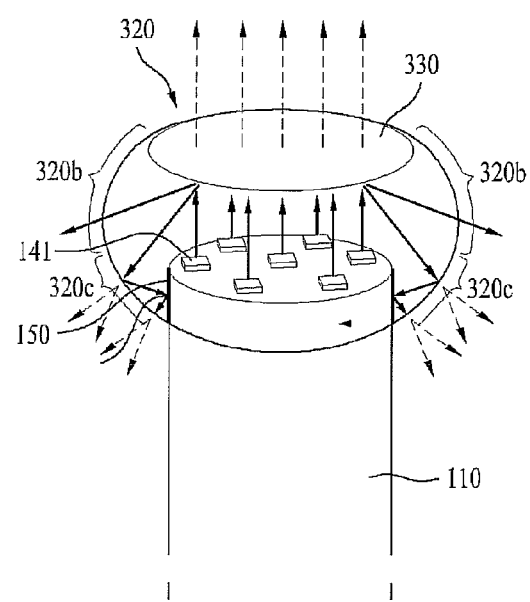

FIGS. 14A and 14B are perspective views of the lighting apparatus according to another embodiment of the present disclosure. In reference to FIG. 14A, a lower region 220c of a bulb 220 may have a linearly decreasing diameter as it gets father from the light emitting module 140. In other words, the lower region 220c of the bulb 220 may have a linearly sloped surface. At this time, the lower region 220c the bulb 220 may be defined as a region that surrounds an upper portion or top end of the heat sink 110, and the sloped surface may change a scattering property of the light reflected through the lower region 220c of the bulb 220.

Alternatively, in reference to FIG. 14B, a lower region 320c of a bulb 320 may have a decreasing sectional area as it gets farther from the light emitting module 140 to have a predetermined curvature along a circumferential direction. That is, the lower region 320c may be a curved surface that curves towards the heat sink 40. At this time, the lower region of the bulb 320 may be defined as a region surrounding an upper portion or top end of the heat sink 110. The curved surface of the lower region 320c may change a light scattering property of the light reflected by reflectors 230, 330 as well as 150 and transmitted through the lower region 320c of the bulb 320. Moreover, the curvature of the lower region 320c may be different than a curvature of the side surface 320b. The bulb 320 having a curved lower region 320c may have improved light distribution properties when compared to the linearly sloped surface 220c.

Moreover, as previously disclosed, a plurality of heat sink fins may be provided along a circumferential side surface of the heat sink 40. The heat sink fins may be vertically oriented and spaced apart from each other a predetermined distance to obtain the desired heat transfer properties of the heat sink. Moreover, the heat sink fins may support the bulb 320 on the heat sink 40. For example, the upper surface of the heat sink fins may be curved to correspond to a shape of the bulb 320 and positioned adjacent to the bulb 320 for support. Alternatively, a protrusion may be provided on an outer side surface of the heat sink such that the lower circumferential edge of the bulb 320 may be seated to support the bulb 320 on the heat sink 40.

Figure 15A:
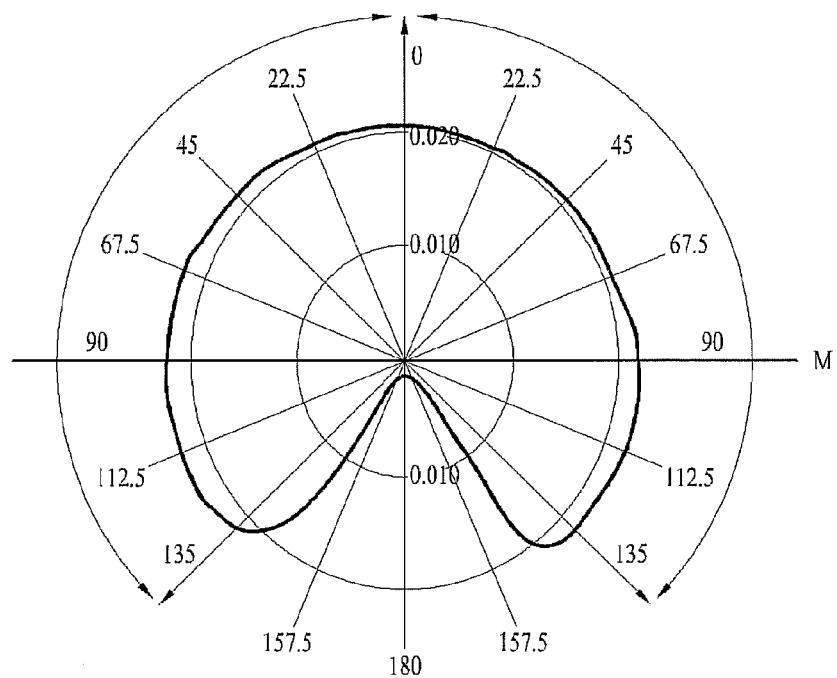
FIGS. 15A and 15B are graphs illustrating an illumination characteristic of the lighting apparatus according to an embodiment of the present disclosure.
Figure 15B:
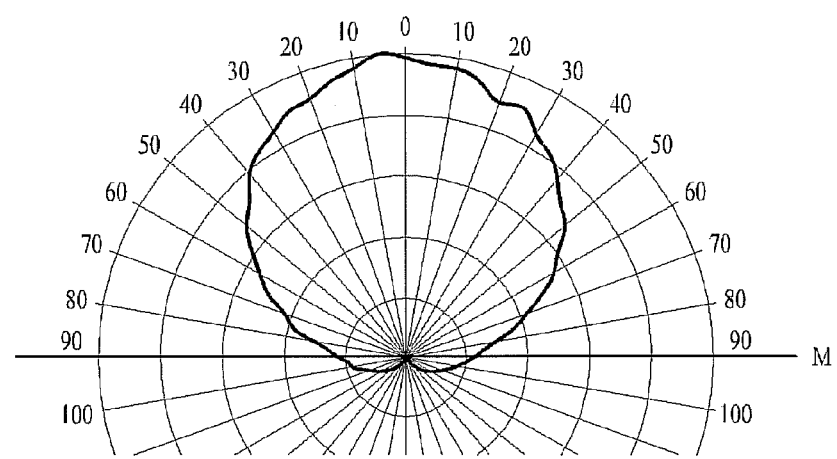

FIGS. 15A and 15B are a graphs illustrating an operational state of the lighting apparatus according to the present disclosure. FIG. 15A is a graph illustrating light distribution of the lighting apparatus of FIG. 3 having the reflectors as discussed above, and FIG. 15B is a graph illustrating light distribution of a lighting apparatus of FIG. 3 without the reflectors of the present disclosure installed therein. The graphs of FIGS. 15A and 15B represent light emission corresponding to a cross-section of the lighting apparatus 1 of FIG. 3. M corresponds to a position of the light emitting module 40, 0° corresponds to a direction towards the top of the lighting apparatus, 180° corresponds to the heat sink side of the lighting apparatus 1, and 90° corresponds to the lateral sides of the lighting apparatus 1.

In reference to FIGS. 3 and 15B, in the lighting apparatus 1 without the reflector, light does not radiate in a range of 90° or more with respect to a light radiation direction of the LED. In reference to FIG. 15A, in the case of the lighting apparatus 1 having the reflectors mounted therein, however, light is emitted in an omnidirectional angular range (e.g., 0° to 135°), with a uniform illumination intensity. Moreover, light does not radiate in a range between 135° to 180° as the light is blocked by the body including the heat sink 110 of the lighting apparatus 1.

Figure 16A:
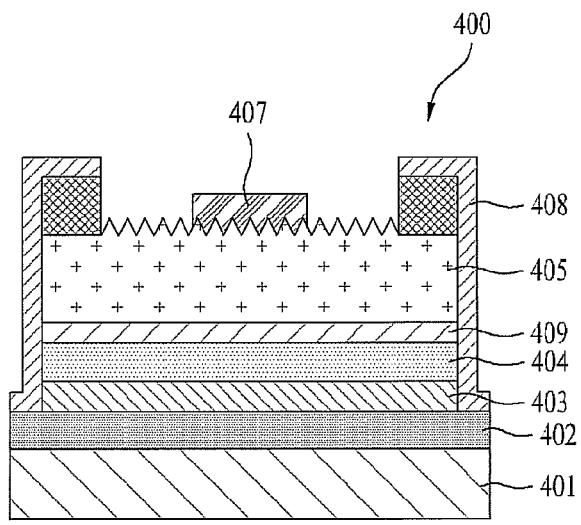
FIGS. 16A and 16B are conceptual diagrams illustrating a light emitting module provided in the lighting apparatus according to an embodiment of the present disclosure.
Figure 16B:
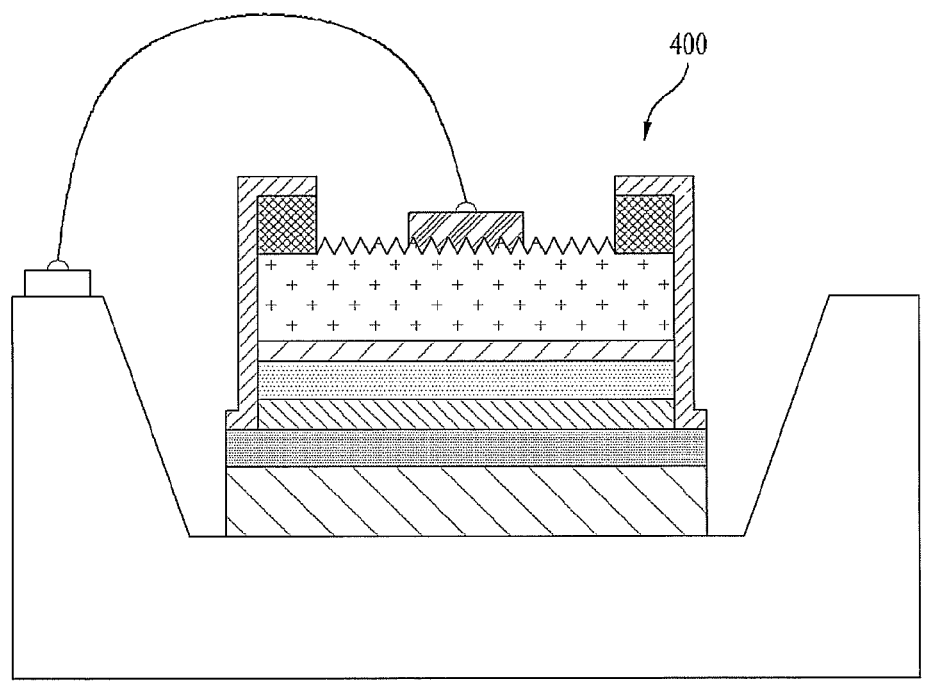

FIGS. 16A and 16B are diagrams of a light emitting module 400 including the thin GaN LED according to an embodiment of the present disclosure. FIG. 16A shows the light emitting module 400 after etching the semiconductor and FIG. 16B shows the light emitting module 400 after packaging.

In reference to FIG. 16A, the thin GaN LED 400 may include a single active layer 409 for emitting light and both cladding layers 404 and 405 surrounding the active layer 409. The cladding layers 404 and 405 are in contact with an electrode 407 and may be p-doped (404) or n-doped (405). The thin GaN LED 400 may further include a support layer 401, a solder layer 402, and a protection member 408 provided under the cladding layers 404 and 405.

The LED of the light emitting module 40, 140 or 400 may grow via a silicon substrate, a sapphire substrate, a SiC substrate, or a GaN substrate, or another appropriate type of substrate. For example, the sapphire substrate is an electrical insulator, with low heat conductivity and a high melting point. Hence, the sapphire substrate may be a thin film substrate which has to be deposited at a high temperature and excellent resistance to a variety of wet etching methods.

As broadly described and embodied herein, the lighting apparatus according to the embodiments of the present disclosure may reflect the light emitted from the LED toward the omnidirectional side region. Hence, the lighting apparatus may radiate the light in a broader range to cover a larger area. Furthermore, the lighting apparatus according to the embodiments of the present disclosure may reduce the glare phenomenon and it can illuminate a region positioned a relatively greater distance from the light source.

Moreover, the lighting apparatus according to the embodiments of the present disclosure may maintain a broad light radiation region, with a uniform intensity of illumination, and it can optimize optical efficiency. Still further, the lighting apparatus according to the embodiments of the present disclosure can reduce the number of the parts and the manufacture cost. In addition, productivity during manufacturing may be improved. Accordingly, the lighting apparatus of the present disclosure allows a more efficient utilization and conservation of energy resources.

As embodied and broadly described herein, a lighting apparatus may include a heat sink; a light emitting module disposed on the heat sink; a bulb configured to surround the at least one light emitting module; and first and second reflection members mounted to the bulb and the heat sink, respectively, to guide a light emitted from the light emitting module to a transmission region of the bulb.

Here, the transmission region may include an omnidirectional side region of the bulb. Moreover, the light emitted via the transmission region of the bulb may include a first light emitted from the light emitting module; a second light reflected by the first reflection member; and a third light reflected by the first and second reflection members. A through-hole may also be provided in a center region of a bulb and the first reflection member may be mounted in the through-hole to form a reflection region of the bulb.

The first reflection member may include at least one of a plane part and a convex or concave curvature part. The first reflection member may include at least one transmission part configured to transmit a light emitted from the light emitting module. The transmission part of the first reflection member may be eccentric with respect to an optical axis of the light emitting module.

The light emitting module may be located substantially on the same plane with a lower end of a transmission region of the bulb. A seating part projected a predetermined height from a lower region of a transmission region of the bulb may be provided at an upper end of the heat sink and the light emitting module is mounted in the seating part. The second reflection member may surround the light emitting module and a side area of the seating part.

The heat sink may include a plurality of heat radiation fins arranged in an outer circumferential surface thereof, spaced apart a predetermined distance from each other along a circumferential direction, and a first longitudinal end of the heat radiation fins may surround a lower end of a transmission region to scatter a light emitted via a transmission region of the bulb. The first longitudinal end of the heat radiation fins may contact with the bulb. The plurality of the heat radiation fins may become higher towards the bulb.

The second reflection member may be mounted in a state of surrounding the light emitting module and the second reflection member may include at least one hole to expose a light radiation region of the light emitting module. An edge part of the second reflection member may be bent toward a lower end of a transmission region of a bulb. An edge part of the second reflection member may contact a lower end of a transmission region of a bulb.

In another aspect of the present disclosure, a lighting apparatus may include a heat sink; a electronic module disposed in the heat sink; a light emitting module mounted on the heat sink, electrically connected with the electronic module; a bulb mounted to the heat sink; and a reflection member configured to reflect a light irradiated from the light emitting module to emit the light toward the heat sink via a transmission region of the bulb. Here, the transmission region may include an omnidirectional side region of the bulb and a lower region which surrounds the heat sink.

A lighting apparatus as broadly disclosed and embodied herein may include a heat sink, a first reflector provided over the heat sink, a light emitting module provided at the first reflector, an enclosure provided over the heat sink to surround the light emitting module, and a second reflector provided over the light emitting module. In this embodiment, at least a portion of light emitted from the light emitting module may be reflected in a direction a prescribed angle below a horizontal plane of the light emitting module.

The first and second reflectors may be positioned such that the portion of light emitted from the light emitting module is reflected at least 45° below the horizontal plane of the light emitting module. The first and second reflectors may be positioned such that light is distributed in an angular range of 0° to 135° relative to an optical axis of the light emitting module and a difference in average light intensity within the angular range is less than or equal to 20%.

The light emitting module and the first and second reflectors may be positioned such that the light is transmitted through the enclosure in a first path in which light is emitted directly from the light emitting module, in a second path in which the light is reflected by the first reflector, and a third path in which the light is reflected by the first and second reflectors.

The enclosure may be a bulb and the second reflector may be positioned on an inner surface of the bulb opposite the light emitting module. The enclosure may have a curved side surface and an opening positioned adjacent to the curved side surface, and wherein the second reflector is mounted in the opening. The bulb includes a lower side surface adjacent to the curved side surface, the lower side surface of the bulb being linear and sloped towards the heat sink.

The bulb may include a lower side surface adjacent to the curved side surface, the lower side surface of the bulb having a predetermined curvature that connects the bulb to the heat sink. The second reflector may be a planar shape, a convex shape, or a concave shape. The second reflector may include at least one transmission region for transmitting the light emitted from the light emitting module through the second reflector and at least one reflective region for reflecting the light emitted form the light emitting module.

The at least one transmission region of the second reflector may be positioned to be concentric to the at least one reflective region of the second reflector. The at least one transmission region of the second reflector may be positioned eccentric with respect to an optical axis of the light emitting module.

In this embodiment, the heat sink may include a first surface that supports the light emitting module and a second surface that supports the enclosure, and wherein the first surface of the heat sink protrudes a predetermined height above the second surface. The heat sink may include a third surface that extends from the first surface to the second surface of the heat sink, and wherein the first reflector is positioned parallel to the first and third surfaces of the heat sink.

The light emitting module may be positioned at a height substantially equal to a height of a lower end of the enclosure. Here, the heat sink may include a plurality of fins arranged on an outer circumferential surface of the heat sink, the plurality of fins having an upper surface, wherein the upper surface of the plurality of fins are positioned adjacent to a lower portion of a curved side surface of the enclosure to scatter the light emitted through the enclosure. The upper surface of the plurality of fins may contact a portion of the side surface of the enclosure. The upper surface of the plurality of fins may be shaped to correspond to the lower portion of the curved side surface of the enclosure.

In this embodiment, the first reflector may include at least one hole that corresponds to a position of at least one LED mounted on the light emitting module, wherein the first reflector is positioned over the light emitting module such that the at least one LED is exposed through the corresponding hole on the first reflector. The first reflector may include an angled surface which is angled toward a lower portion of the enclosure. The first reflector may be secured on the heat sink. An edge of the first reflector may contact a lower portion of the enclosure.

Moreover, the second reflector may include a body mounted to an opening in the bulb and a reflective film provided on an inner surface of the body to face the light emitting module. The second reflector may include at least one hook provided on a circumferential surface of the body, and an edge portion on the reflective film that is disposed in the hooks. The at least one hook may be connected to an edge of the opening in the bulb. Moreover, the body of the second reflector may include first threads formed on an outer circumferential surface of the body, and the enclosure may include an opening having second threads that correspond to the first threads. In this case, the second reflector may be screwed into the opening in the enclosure using the first and second threads.

The lighting apparatus of this embodiment may further include a third reflector positioned to protrude a predetermined distance from the first reflector towards the second reflector. The third reflector may contact the first reflector and the second reflector. The light emitting module may be arranged at the first reflector to surround the third reflector. Moreover, an electronic module provided in the heat sink and electrically connected to the light emitting module.

In another embodiment, a lighting apparatus may include a heat sink, a light emitting module provided over the heat sink, a first reflector provided over the heat sink and formed to surround the light emitting module, an enclosure provided around an upper portion of the heat sink to surround the light emitting module and the first reflector, and a second reflector provided at an upper portion of the enclosure and positioned a prescribed distance over the light emitting module and the first reflector. In this embodiment, the light emitting module may be positioned relative to the first and second reflectors to emit light through the enclosure within a prescribed angular range relative to the enclosure, the light having a prescribed intensity within the prescribed angular range.

Therefore, as mentioned above, the lighting apparatus according to the present disclosure may provide the following effects. The lighting apparatus according to the present disclosure may reflect lights radiated from a light-emitting diode toward omnidirectional regions to radiate lights broadly with a uniform light intensity. Furthermore, the lighting apparatus according to the present disclosure may maintain a broad light radiation region with a uniform intensity of illumination and optimize optical efficiency. Still further, the lighting apparatus according to the present disclosure may illuminate a light radiation region distant from a light source. Moreover, the lighting apparatus according to the present disclosure may reduce the number of parts as well as manufacturing costs.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A lighting apparatus comprising:
a heat sink;
a first reflector provided over the heat sink;
a light emitting module provided at the first reflector and including at least one LED;
an enclosure provided over the heat sink to surround the light emitting module, the enclosure having a curved side surface;
a second reflector provided over the light emitting module; and
a third reflector positioned to protrude a predetermined distance from the first reflector towards the second reflector,
wherein at least a portion of light emitted from the light emitting module is reflected in a direction a prescribed angle below a horizontal plane of the light emitting module and in a direction of the curved side surface of the enclosure.

2. The lighting apparatus of claim 1, wherein the third reflector contacts the first reflector and the second reflector.

3. The lighting apparatus of claim 1, wherein the third reflector contacts the first reflector and does not contact the second reflector.

4. The lighting apparatus of claim 1, wherein the light emitting module is arranged at the first reflector to surround the third reflector.

5. The lighting apparatus of claim 1, wherein the third reflector is a pole.

6. The lighting apparatus of claim 1, wherein a central axis of the third reflector is positioned along a central axis of the enclosure.

7. The lighting apparatus of claim 1, wherein an edge of the first reflector contacts a lower portion of the enclosure.

8. The lighting apparatus of claim 1, wherein the second reflector includes
a body mounted to an opening in the enclosure; and
a reflective film provided on an inner surface of the body to face the light emitting module.

9. The lighting apparatus of claim 8, wherein the second reflector includes at least one hook provided on a circumferential surface of the body, and
an edge portion on the reflective film that is disposed in the hooks.

10. The lighting apparatus of claim 9, wherein the at least one hook is connected to an edge of the opening in the enclosure.

11. The lighting apparatus of claim 9, wherein
the body of the second reflector includes first threads formed on an outer circumferential surface of the body, and
the enclosure includes an opening having second threads that correspond to the first threads,
wherein the second reflector is screwed into the opening in the enclosure using the first and second threads.

12. The lighting apparatus of claim 1, further comprising an electronic module provided in the heat sink and electrically connected to the light emitting module.

13. A lighting apparatus comprising:
a heat sink;
a first reflector provided over the heat sink;
a light emitting module provided at the first reflector and including at least one LED;
an enclosure provided over the heat sink to surround the light emitting module; and
a second reflector provided over the light emitting module,
wherein the heat sink includes a first surface that supports the light emitting module, a second surface that supports the enclosure, and a third surface that extends from the first surface to the second surface of the heat sink,
wherein the first surface of the heat sink protrudes a predetermined height above the second surface and the first reflector is positioned parallel to the first and third surfaces of the heat sink, and
wherein at least a portion of light emitted from the light emitting module is reflected in a direction a prescribed angle below a horizontal plane of the light emitting module.

14. The lighting apparatus of claim 13, further comprising a third reflector positioned to protrude a predetermined distance from the first reflector towards the second reflector.

15. The lighting apparatus of claim 13, wherein the third reflector contacts the first reflector and the second reflector.

16. The lighting apparatus of claim 13, wherein the third reflector contacts the first reflector and does not contact the second reflector.

17. The lighting apparatus of claim 13, wherein the light emitting module is arranged at the first reflector to surround the third reflector.

18. The lighting apparatus of claim 13, wherein the third reflector is a pole.

19. The lighting apparatus of claim 13, wherein a central axis of the third reflector is positioned along a central axis of the enclosure.

* * * * *